(12) United States Patent
Hynecek

(10) Patent No.: US 10,574,912 B2
(45) Date of Patent: Feb. 25, 2020

(54) METHOD AND APPARATUS FOR AN IMAGE SENSOR CAPABLE OF SIMULTANEOUS INTEGRATION OF ELECTRONS AND HOLES

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/928,450

(22) Filed: Mar. 22, 2018

(65) Prior Publication Data
US 2019/0297292 A1 Sep. 26, 2019

(51) Int. Cl.
| | |
|---|---|
| H04N 5/355 | (2011.01) |
| H04N 5/378 | (2011.01) |
| H01L 27/146 | (2006.01) |
| H04N 5/3745 | (2011.01) |
| H04N 5/363 | (2011.01) |
| H04N 5/369 | (2011.01) |

(52) U.S. Cl.
CPC ......... *H04N 5/355* (2013.01); *H01L 27/1463* (2013.01); *H01L 27/1464* (2013.01); *H01L 27/14612* (2013.01); *H01L 27/14634* (2013.01); *H04N 5/363* (2013.01); *H04N 5/378* (2013.01); *H04N 5/379* (2018.08); *H04N 5/3745* (2013.01)

(58) Field of Classification Search
CPC ..... H04N 5/355–3658; H01L 31/0352–03529; H01L 27/146–14681
See application file for complete search history.

(56) References Cited

U.S. PATENT DOCUMENTS

| | | | |
|---|---|---|---|
| 7,439,561 B2 | 10/2008 | Adkisson | |
| 7,633,042 B2 | 12/2009 | Adkisson | |
| 2014/0320685 A1* | 10/2014 | Takenaka | H04N 5/32 348/218.1 |
| 2017/0186806 A1* | 6/2017 | Lalanne | H01L 27/14656 |
| 2018/0198997 A1* | 7/2018 | Otaka | H04N 5/3575 |

OTHER PUBLICATIONS

Frederic Lalanne, et al., A native HDR 115dB 3.2um BSI pixel using electron and hole collection, International Image Sensor Society Workshop, 2017, pp. 278-281, IISS, Hiroshima, Japan.

* cited by examiner

*Primary Examiner* — Paul M Berardesca
(74) *Attorney, Agent, or Firm* — The Noblitt, Group, PLLC; Hettie L. Haines

(57) ABSTRACT

Various embodiments of the present technology may comprise methods and apparatus for an image sensor capable of simultaneous integration of electrons and holes. According to an exemplary embodiment, the image sensor comprises a backside-illuminated hybrid bonded stacked chip image sensor comprising a pixel circuit array, and each pixel circuit comprising a charge storage capacitor oriented in a vertical direction in a deep trench isolation region. Both the electrons and holes are generated and integrated (collected) in the pixel simultaneously, and the charge storage capacitor is used for storing the signal generated by holes in the high light level illuminated pixels.

17 Claims, 7 Drawing Sheets

METHOD AND APPARATUS FOR AN IMAGE SENSOR CAPABLE OF SIMULTANEOUS INTEGRATION OF ELECTRONS AND HOLES

BACKGROUND OF THE TECHNOLOGY

Electronic devices, such as cellular telephones, cameras, and computers, commonly use image sensors to capture images by sensing light. A typical imager sensor includes a focal plane array of pixels, and each pixel includes a photosensor, such as a photogate, photoconductor, or photodiode, for accumulating photo-generated charge in a portion of the substrate. When photons impinge on the photosensor, electron-hole pairs are generated. Conventional image sensors convert the electrons that are integrated (collected) in the pixels into a voltage, and the holes are generally discarded into the substrate.

After completion of integration cycle, collected electron charge is converted into a voltage, which is supplied to an output terminal of the image sensor. In a CMOS image sensor, the charge-to-voltage conversion is accomplished directly in the pixels themselves and the analog pixel voltage is transferred to the output terminal through various pixel addressing and scanning schemes. The analog signal can also be converted on-chip to a digital equivalent before reaching the chip output.

The pixels utilize a buffer amplifier, typically a source follower (SF) transistor to drive the sense lines that are connected to the pixels by suitable addressing transistors. After charge-to-voltage conversion is completed and the resulting signal is transferred out from the pixels, the pixels are reset in order to be ready for accumulation of new charge. In pixels that utilize a floating diffusion (FD) node as a charge detection node, the reset is accomplished by turning on a reset transistor that conductively connects the FD node to a voltage reference, which is typically the pixel SF drain node. This step removes collected charge, however, it generates kTC-reset noise. This kTC-reset noise is generally removed from the signal by a correlated double sampling (CDS) signal processing technique in order to achieve the desired low noise performance.

The typical CMOS image sensors that utilize the CDS concept usually require three (3T) or four transistors (4T) in the pixel—one of which serves as a charge transferring transistor. However, it is difficult adapting it for the high dynamic range (HDR) operation, where a large amount of charge must be stored in the pixels. Conventional methods for addressing this issue include: assigning to some sensor rows or pixels in a group of pixels a shorter integration time; using a logarithmic charge-to-voltage conversion characteristic; and incorporating charge storage capacitors into the pixels. These conventional methods, however, are not ideal because one or more may result in sacrificing the low light level resolution, a shorter integration time may lead to missing the detection of some short pulse duration light sources; logarithmic charge-to-voltage conversion may result in higher signal noise; and/or increasing the overall size of the chip due to having elements that occupy a large area in the pixel.

BRIEF DESCRIPTION OF THE DRAWINGS

A more complete understanding of the present technology may be derived by referring to the detailed description when considered in connection with the following illustrative figures. In the following figures, same reference numbers refer to similar elements and steps throughout the figures.

DETAILED DESCRIPTION OF EXEMPLARY EMBODIMENTS

The present technology may be described in terms of functional block components and various signal processing steps. Such functional blocks may be realized by any number of components configured to perform the specified functions and achieve the various results. For example, the present technology may employ various semiconductor devices, transistors, capacitors, and the like, which may carry out a variety of functions. In addition, the present technology may be practiced in conjunction with any number of systems, such as portable devices, consumer electronics, automotive systems, surveillance systems, and the like, and the system described is merely one exemplary application for the technology. Further, the present technology may employ any suitable pixel architecture, readout scheme, and/or device layout.

Methods and apparatus for an image sensor according to various aspects of the present invention may provide improved dynamic range. The methods and apparatus for an image sensor according to various aspects of the present technology may operate in conjunction with any suitable camera application, such as a digital camera, a cellular telephone, a tablet computer, a web camera, a video camera, a video surveillance system, an automotive imaging system, a video gaming system with imaging capabilities, or any other desired imaging system. Further, methods and apparatus for the image sensor may be utilized with any suitable imaging system, such as a camera system, video system, machine vision, vehicle navigation, surveillance system, motion detection system, and the like.

Figure 1:
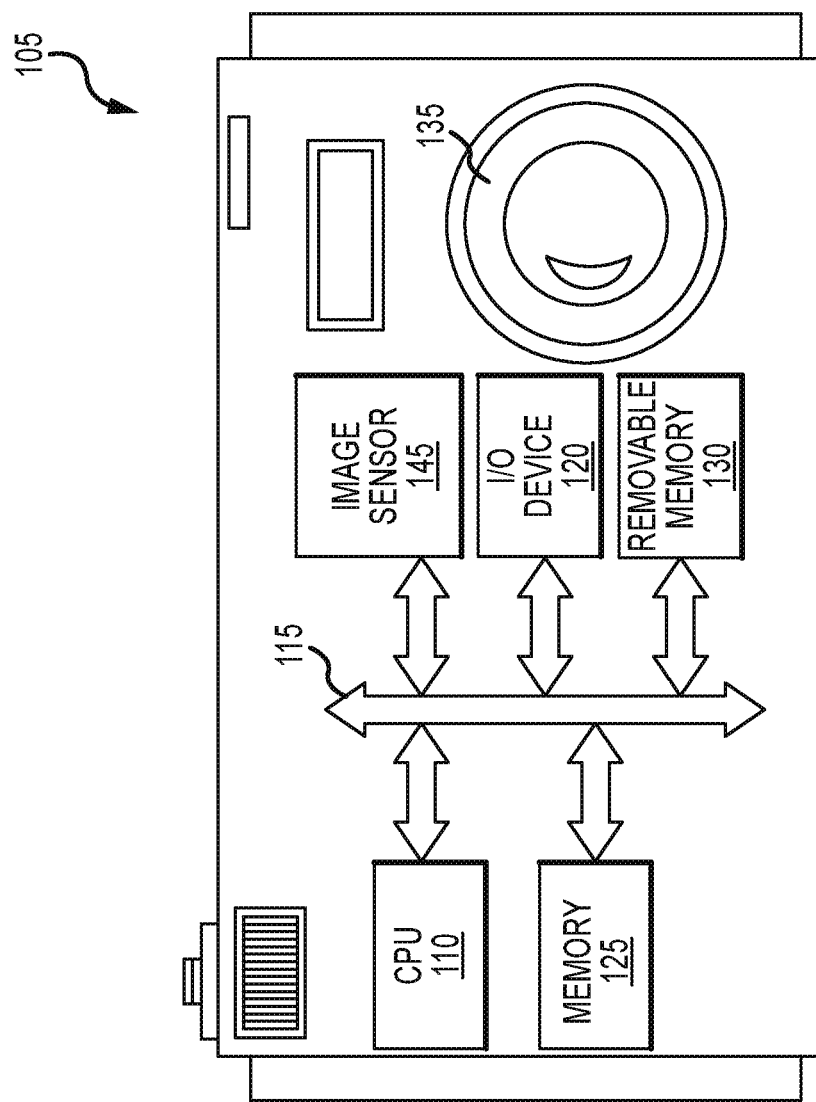
FIG. 1 representatively illustrates an imaging system in accordance with an exemplary embodiment of the present technology.

Referring now to FIG. 1, an exemplary imaging system may comprise an electronic device, such as a digital camera 105, configured to capture image data. For example, the imaging system may comprise a central processing unit (CPU) 110 that communicates with various devices over a bus 115. Some of the devices connected to the bus 115 may provide communication into and out of the system, for example an input/output (I/O) device 120.

The imaging system may be configured to construct a digital high dynamic range (HDR) image using low light level signals and high light level signals. The imaging system may further comprise a display screen (not shown) for viewing the digital image. The display screen may be coupled to and configured to send and/or receive information, such as image data, from the bus 115.

Other devices connected to the bus 115 may comprise a memory 125, for example a random access memory (RAM), and/or a removable memory 130, such as a USB drive, memory card, SD card, and the like. While the bus 115 is illustrated as a single bus, any number of busses may be used to provide communication paths to interconnect the devices.

The imaging system may further comprise an image sensor 145 for capturing and conveying image data. For example, the image sensor 145 may comprise an array of pixel circuits (not shown) to detect the light and convey information that constitutes an image by converting the variable attenuation of photon flow (as they pass through or reflect off object) into electrical signals. The image sensor 135 may be implemented in conjunction with any appropriate technology, such as active pixel sensors in CMOS technology.

In various embodiments, the imaging system may comprise a lens 135 to focus an image or scene on the image sensor 145. For example, light may enter the imaging system through a lens 135 and strike the image sensor 135. The lens 135 may include a fixed and/or adjustable focus lens.

In various embodiments, the image sensor 145 may be configured to process image data. For example, the image sensor 145 may perform image reconstruction, such as demosaicing, white balancing, noise reduction, color correction, and the like. The image sensor 145 may further comprise various signal processing circuits and/or systems, such as sample-and-hold circuitry, an analog-to-digital converter, an amplifier, and the like, used to convert the pixel charge to a digital image.

Referring to FIGS. 2 and 4-7, each pixel circuit 200 within the array may capture a portion of an image or scene. The pixel circuit 200 may comprise one or more integrated circuits, such as a signal processing circuit, a charge storage device, a charge conversion circuit, a charge transfer device, and the like, to detect light signal and convert the detected light signal into a charge representing a pixel signal.

According to various embodiments, the pixel circuit 200 comprises a photodetector 201 that converts light (photons) into electric charge consisting of electrons and holes (electron-hole pairs), which may be referred to individually as electron charge and hole charge. The photodetector 201 may comprise, for example, a photodiode, a photogate, or any other appropriate device responsive to light. In an exemplary embodiment, the photodetector 201 comprises a pinned photodiode with a floating body (also referred to as a floating body node 202).

According to various embodiments, the pixel circuit 200 may further comprise a device suitable for facilitating transfer of charge out of the photodetector 201. For example, the pixel circuit 200 may comprise a charge overflow device 204 configured to transfer electron overflow charge from the photodetector 201 to a drain 224. According to various embodiments, the charge overflow device 204 operates to facilitate electron charge transfer from photodetector 201 after the photodetector 201 has reached a predetermined charge threshold. The charge overflow device 204 may comprise any suitable device that facilitates the transfer of the electron charge that the photodetector could not accommodate, such as a junction gate field-effect transistor (JFET), metal-oxide-semiconductor field-effect transistor (MOSFET, MOS), and the like. When the overflow electron charge begins to flow out of the pinned photodiode 201, the corresponding hole charge begins to flow to the capacitor 209 and start charging it from the previously-established reset level. The hole charge stored on the capacitor 209 equals the electron overflow charge due to the charge conservation law.

According to various embodiments, the pixel circuit may further comprise a charge transfer transistor 203 configured to transfer the electron charge from the photodetector 201 to a floating diffusion node 206 (also referred to as a floating diffusion region). The charge transfer transistor 203 may comprise a MOS transistor, or a buried channel MOS transistor (for example, as illustrated in FIGS. 4-7), comprising a gate terminal connected to a signal line 211, wherein the signal line is used to transmit a signal Tx to operate the charge transfer transistor 203. For example, when the signal Tx is at its high bias level, the transfer transistor 203 turns on to transfer charge from the photodetector 201 onto the floating diffusion node 206.

Referring now to FIGS. 4-7, the MOS transistor 203 may be configured as a buried channel MOS transistor having a buried channel implant that provides the charge overflow function. In the present embodiments, the transfer transistor 203 may also be referred to as a charge overflow device.

The floating diffusion node 206 may be connected to a first readout circuit configured to process and/or readout the electron charge-generated voltage on the floating diffusion node 206 using a correlated double sampling (CDS) technique to suppress kTC-reset noise that is generated when the FD node is reset. The capacitor 209 is also reset but without using the CDS reset noise suppression technique. A minimum threshold number of electrons $N_{ne}$ required to mask kTC-reset noise of capacitor 209 without the CDS technique is calculated according to the following formula:

$$N_{ne}=kTC/q^2=1,600e$$

where q is the electron charge, k is Boltzmann's constant, T is the absolute ambient temperature measured in degrees of Kelvin, and C is the capacitance of the capacitor 209, which is approximately 10 fF. The electron charge may be further converted to a voltage that represents a low light level signal that is used to construct the HDR image.

The capacitor 209 may be used to store hole charge from the photodetector 201, for example approximately 5,000e to 8,000e. The capacitor 209 may be connected to the floating body node 202 and a ground potential GND. In various embodiments, the second reset transistor 217 may be used to reset the capacitor 209 to the ground potential GND. According to various embodiments, the hole charge collecting capacitor 209 does not undergo the CDS reset operation because kTC-reset noise generated by resetting the capacitor 209 is much smaller than the photon noise generated by the high light level overflow signal and may be neglected. The hole charge may be further converted to a voltage that represents a high light level signal that is used to construct the HDR image.

The first readout circuit is connected to the floating diffusion node 206 and configured to deliver (i.e., output) a corresponding electron charge-generated output voltage $V_{OUT\_e}$ on a first sense line 220. For example, the first readout circuit may comprise a first source follower transistor 207, a first reset transistor 205, and a first row select transistor 208. The first source follower transistor 207, the first reset transistor 205, and the first row select transistor 208 may comprise a conventional MOSFET, each comprising a gate terminal, a source terminal, and a drain terminal. The gate terminal of the first reset transistor 205 may be connected to a second signal line 212, wherein the second signal line 212 is used to transmit a first reset signal $R_{X1}$ to the gate of the reset transistor 205 to reset a voltage bias level of the FD node 206 to the reference voltage bias level $V_{DD}$. Similarly, the gate terminal of the first row select transistor 208 may be connected to a third signal line 213, wherein the third signal line 213 is used to transmit a first row select signal $S_{X1}$ to the gate of the transistor 208.

A second readout circuit is connected to the capacitor 209 and configured to deliver (i.e., output) a corresponding hole charge-generated output voltage $V_{OUT\_h}$ on a second sense line 221. For example, the second readout circuit may comprise a second source follower transistor 218, a second reset transistor 217, and a second row select transistor 219. The second source follower transistor 218, the second reset transistor 217, and the second row select transistor 219 may comprise a conventional MOSFET, each comprising a gate terminal, a source terminal, and a drain terminal. The gate terminal of the second reset transistor 217 may be connected to a third signal line 228, wherein the third signal line 228 is used to transmit a second reset signal $R_{X2}$ to the gate terminal of the reset transistor 217 to reset a voltage bias level of the node 210 to ground potential GND. Similarly, the gate terminal of the second row select transistor 219 may be connected to a fourth signal line 227, wherein the fourth signal line 227 is used to transmit a second row select signal $S_{X2}$ to the gate of the transistor 219.

Figure 4:
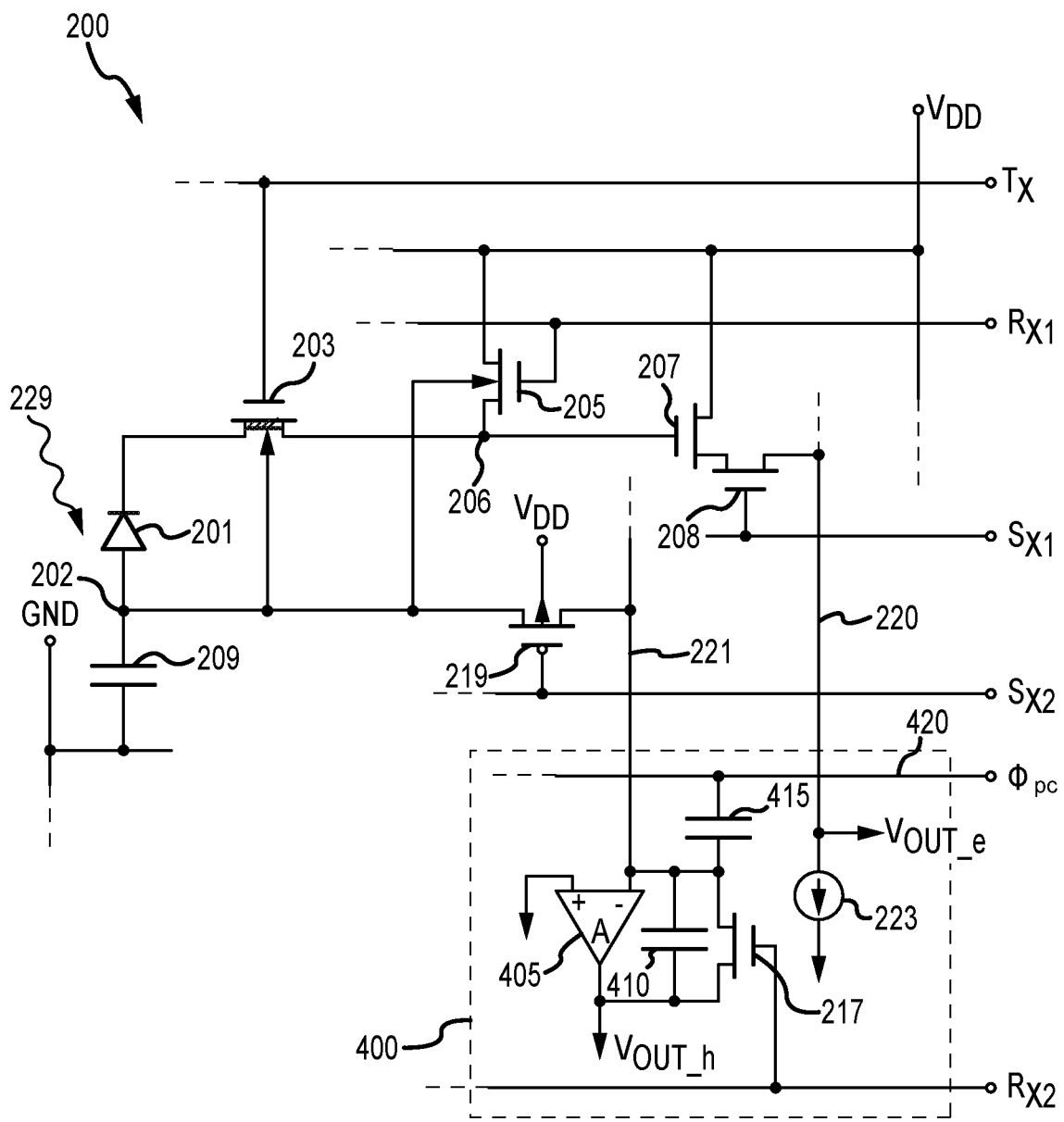
FIG. 4 is a circuit diagram in accordance with a second embodiment of the present technology.
Figure 5:
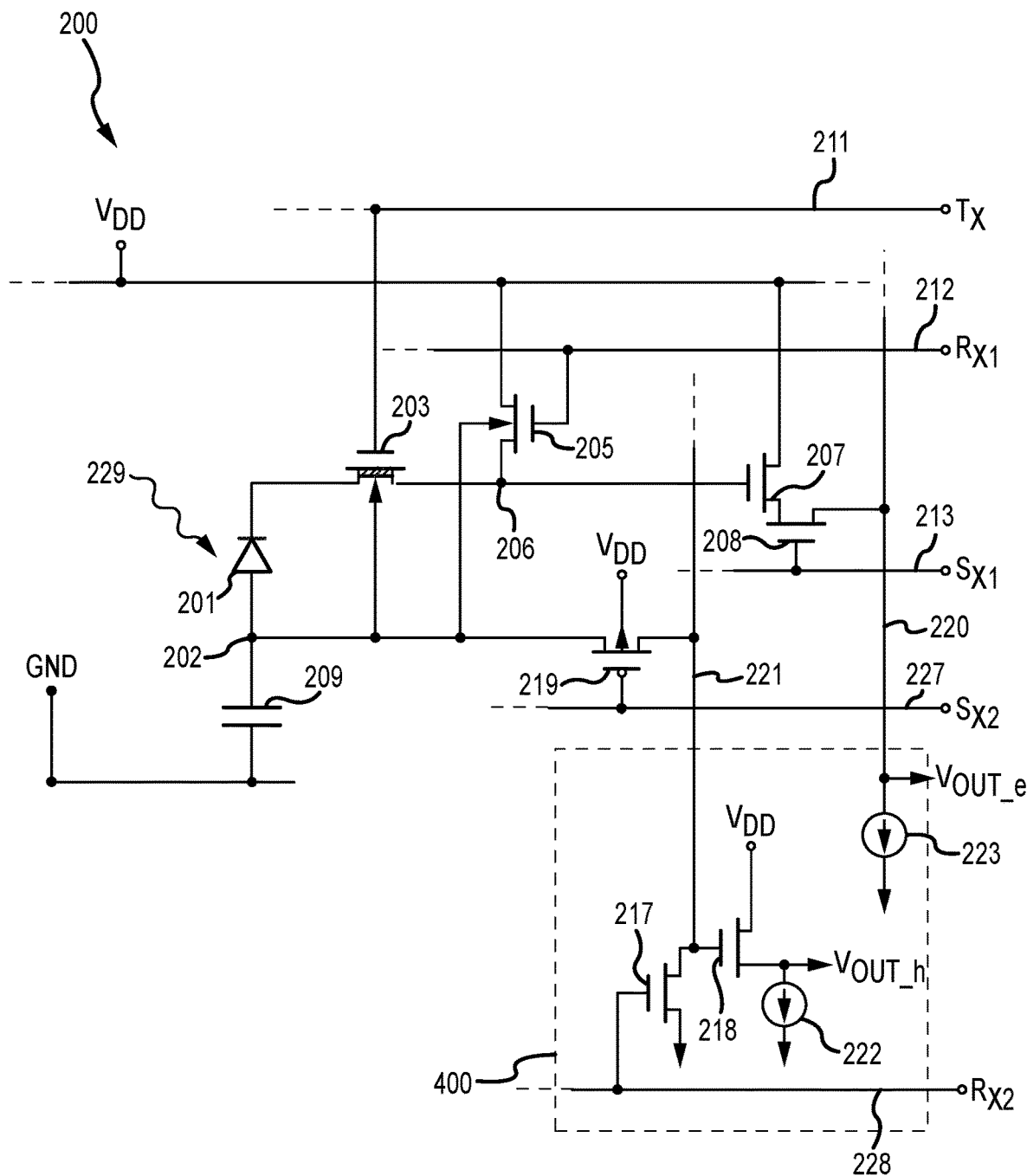
FIG. 5 is a circuit diagram in accordance with a third embodiment of the present technology.

According to various embodiments, and referring to FIGS. 4 and 5, the second row select transistor 219 may comprise a p-channel transistor. Conversely, in other embodiments, and referring to FIGS. 2, 6, and 7, the second row select transistor 219 may comprise an n-channel transistor. The transistor type may be selected according to the particular pixel circuit layout, desired function, and the like. For example, a p-channel second row select transistor may provide lower parasitic capacitance on the second sense line 221.

In various embodiments, the pixel circuit 200 may further comprise a first current source 223 connected to and configured to provide a bias current to the first readout circuit. Similarly, the pixel circuit 200 may further comprise a second current source 222 connected to and configured to provide a bias current to the second readout circuit.

In one embodiment, and referring to FIG. 4, the second readout circuit may comprise an amplifier 405 with a feedback capacitor 410 connected between an inverting input terminal of the amplifier 405 and an output terminal of the amplifier 405. In the present embodiment, the amplifier 405 operates to convert the hole charge-generated voltage on the capacitor 209 to the hole charge generated output voltage $V_{OUT\_h}$.

Figure 7:
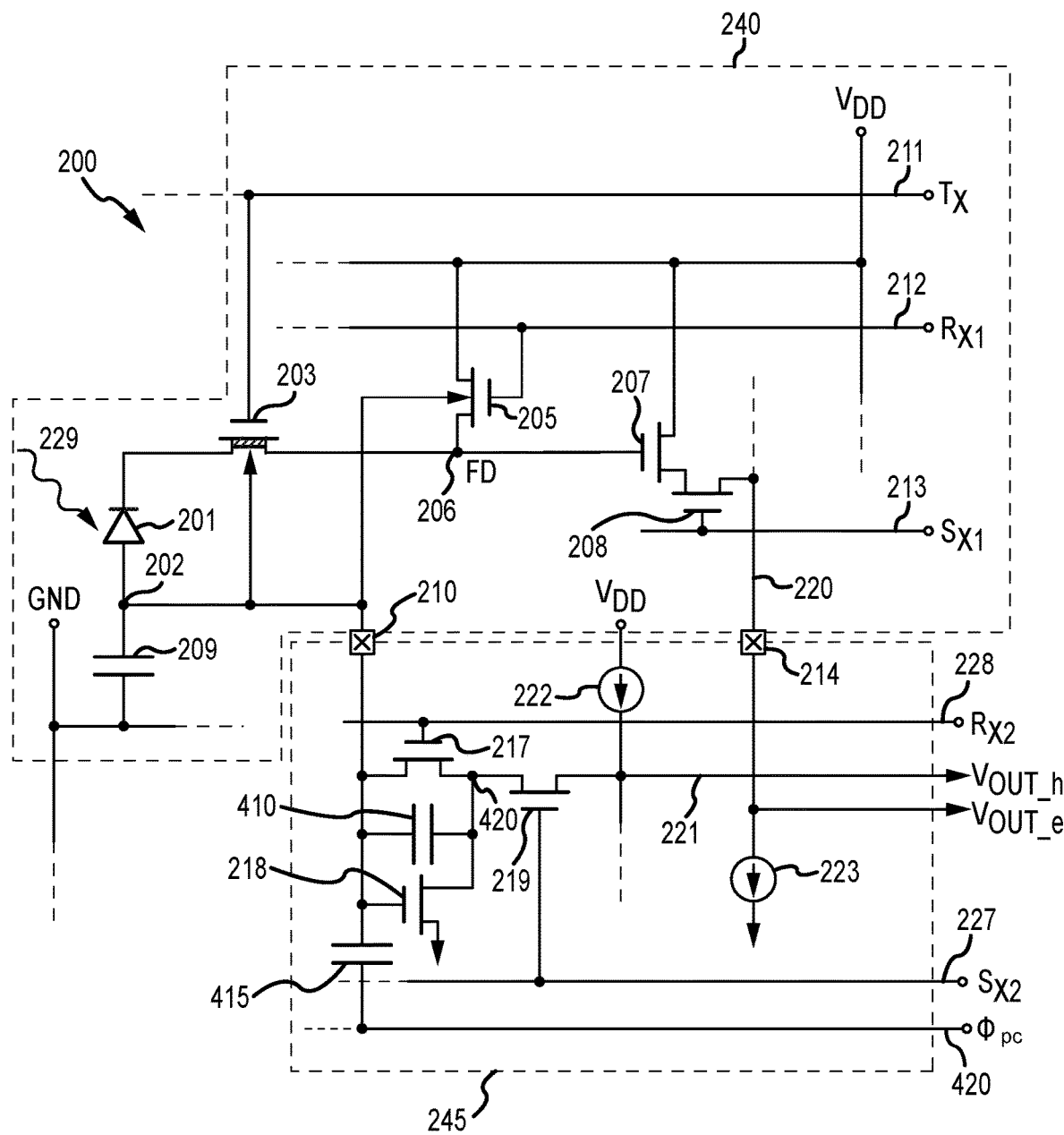
FIG. 7 is a circuit diagram in accordance with a fifth embodiment of the present technology.

In one embodiment, and referring to FIG. 7, the feedback capacitor 410 may be connected between the floating body node 210/202 and a drain node 420 of the transistor 218, wherein the transistor 218 functions as an inverting amplifier.

In various embodiments, and referring to FIGS. 4 and 7, the pixel circuit 200 may comprise a pre-charge capacitance represented by a capacitor 415. A pre-charge signal $\Phi_{pc}$ is supplied to the pre-charge capacitor 415 through a signal line 420.

Figure 2:
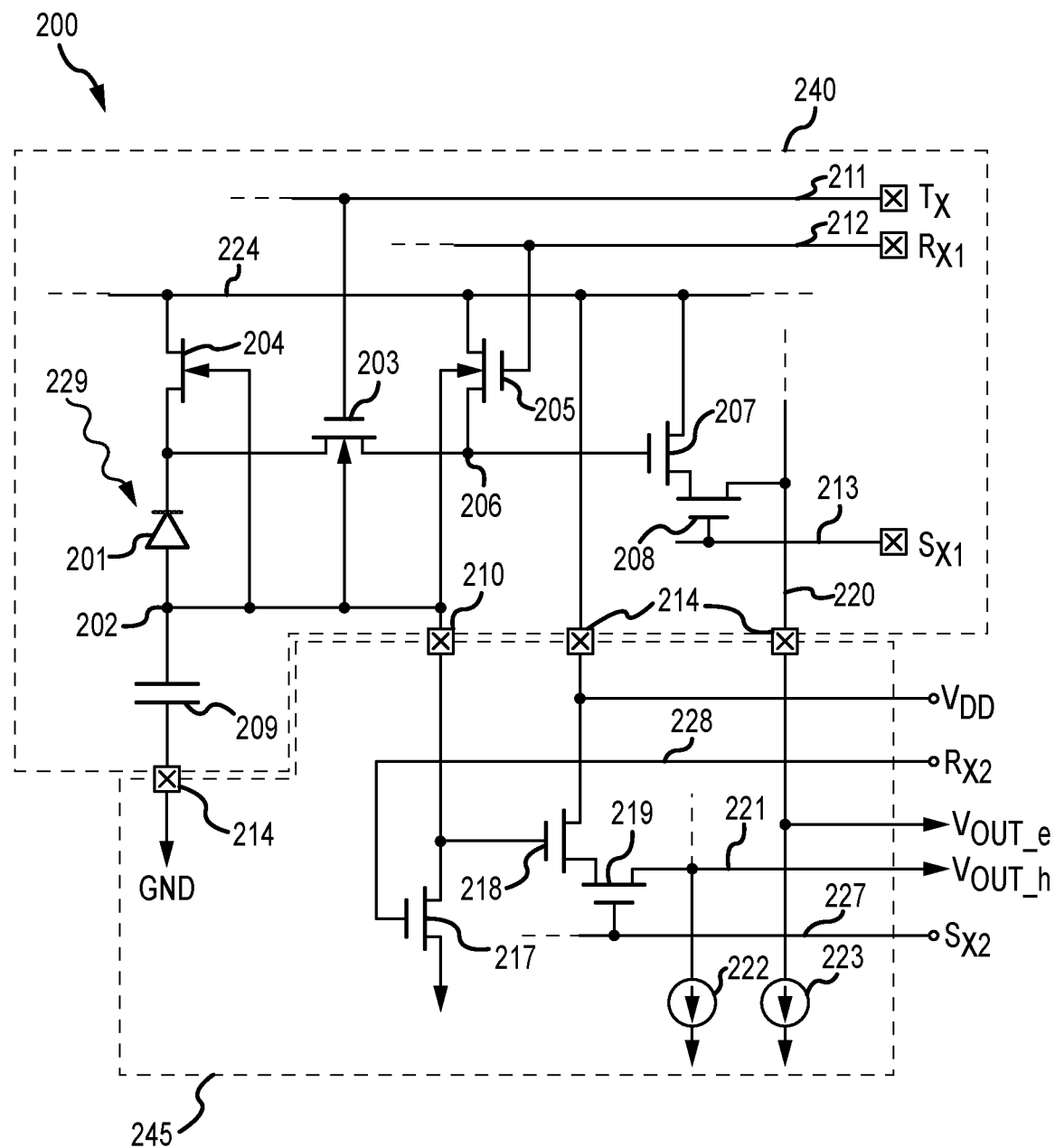
FIG. 2 is a circuit diagram in accordance with a first embodiment of the present technology.
Figure 6:
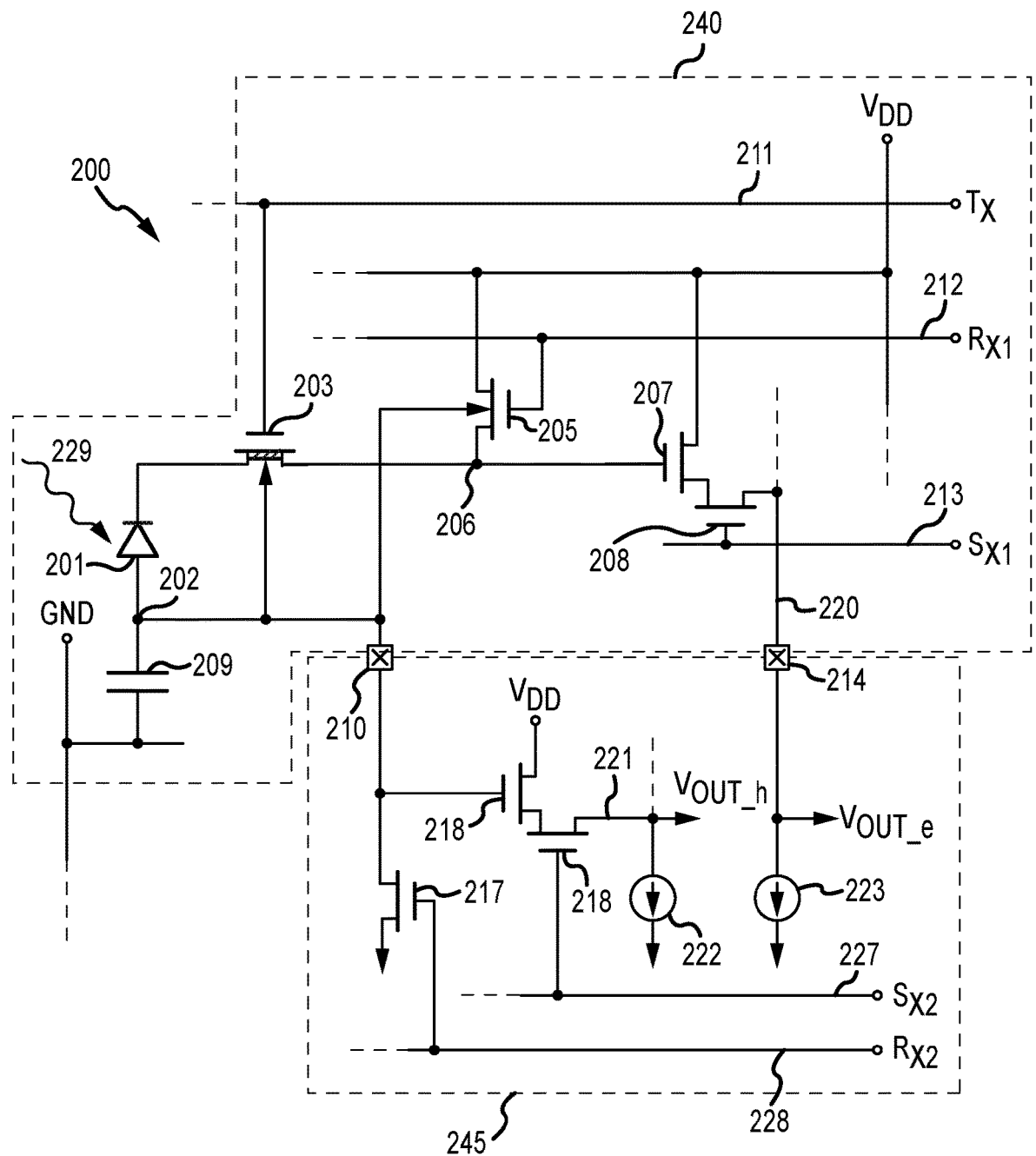
FIG. 6 is a circuit diagram in accordance with a fourth embodiment of the present technology.

In various embodiments, and referring to FIGS. 2, 6, and 7, the pixel circuit 200 may be arranged on a first chip 240 and a second chip 245, wherein the first and second chips 240, 245 are stacked vertically. In the present embodiments, the first and second chips 240, 245 may be bonded together with one or more types of bonding and/or electrical connections. For example, the pixel circuit 200 may comprise a hybrid bond 210 which is located in each pixel of the pixel array and/or connections 214 located on a periphery of the array.

According to the present embodiments, the first chip 240 may comprise the photodetector 201, the capacitor 209, the charge overflow device 204, the first charge transfer transistor 203, the first reset transistor 205, the first source follower transistor 207, and the first row select transistor 208. The second chip 245 may comprise the second reset transistor 217, the second source follower transistor 218, and the second row select transistor 219. According to the present embodiments, the second chip 245 may further comprise the first and second current sources 223, 222. In an alternative embodiment, the current sources 223, 222, and other circuits such as the analog-to-digital converter, could be located on a third chip (not shown) in a stacked chip arrangement.

In various alternative embodiments, and referring to FIGS. 4 and 5, the pixel circuit 200 may be arranged in a non-stacked configuration. For example, pixel circuit 200 may be formed on a single chip with a portion 400 of the pixel circuit 200 formed on the periphery of the chip pixel array. The portion 400 of the pixel circuit 200 formed on the periphery may comprise substantially the same elements as that of the second chip 245 in the stacked chip arrangement described above. In the present embodiments, the pixel circuit 200 elements are connected using conventional methods, such as metal wiring.

Figure 3:
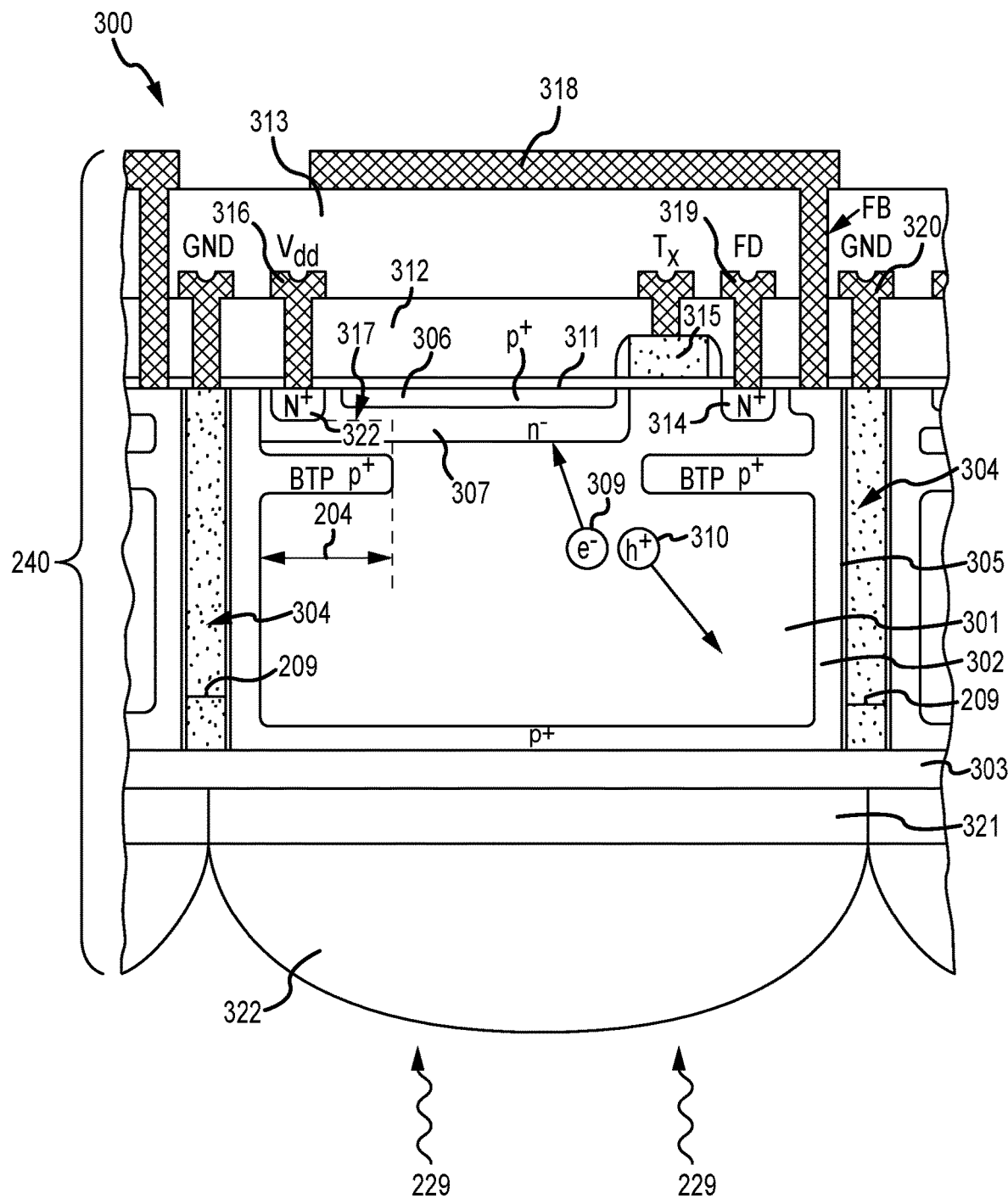
FIG. 3 is a cross-sectional view of a pixel circuit in accordance with various embodiments of the present technology.

Referring to FIGS. 2 and 3, a solid-state pixel structure 300 corresponding to a portion of the pixel circuit 200 formed on the first chip 240, comprises an epitaxial substrate layer 301 (also referred to as a pixel body region) covered with a first oxide layer 303 on one surface and a second oxide layer 311 on an opposing second surface, wherein each oxide layer 303, 311 isolates and/or protects the epitaxial substrate 301. The second oxide layer 311 also serves to isolate a polysilicon transfer gate 315 (corresponding to the transfer transistor 203) from the epitaxial substrate 301.

The pixel body region 301 is isolated from a neighboring pixel body by a deep trench isolation region 304 that is filled with a doped polysilicon material or any other conductive material such as Tungsten. A third oxide layer 305 may be disposed on the interior walls of the deep trench isolation region 304 to isolate the doped polysilicon material from the pixel body region 301 and thereby form the capacitor 209, which is connected to the ground bias potential through a via 320. The via 320 may be filled with a conducting material, such as tungsten. Because of the vertical orientation of the capacitor 209, it is possible to achieve a large charge storage capacity and high dynamic range without sacrificing the pixel area exposed to light. This results in small sized pixels and high quantum efficiency, which result in improved sensor performance and lower cost.

The epitaxial layer 301 may comprise a first p+ type doped layer 302 along a side wall region and a bottom region. Further, the epitaxial layer 301 may comprise a second p+ type doped layer 306 along a top region to passivate the interface states and thus minimize the generation of dark current by these interface states. The second p+ type doped layer 306 also forms a p+ type doped connection to the pixel body region 301 that collects photon-generated holes 310 (i.e., hole charge). The second p+ type doped region 306 also extends partially through charge overflow device 204, in this case the charge overflow device is a JFET. The p+ type doped region 302 may extend under the transfer gate 315 and under the transistor 204 to provide a stable back gate potential reference for these structures.

The first p+ type doped region 302 is connected to the hybrid bond pad 318 through a via connection similarly as the ground connection via 320. The hybrid bond pad 318 provides the connection for the floating body of each pixel circuit 200 to the second chip 245. In an exemplary embodiment, the hybrid bond pad 318 is located over the second p+ type doped layer 306 to reflect photons that may not have been absorbed and generated e-h pairs back to the photodiode. This feature may be useful for an image sensor having near-infrared sensing capabilities.

The solid-state pixel structure 300 comprises two n+ type doped regions 314, 322 that form the floating diffusion region 206 and a drain terminal of the JFET. Each n+ type doped region 314, 322 may be further connected to a metal interconnect (not shown) by the vias 319, 316, respectively. The p+ type doped layer 306 and an n− type doped layer 307 form the pinned photodiode region that collects the photon-generated electrons 309. The solid-state pixel structure 300 may further comprise an implanted p− type doped layer 317 used to adjust a threshold voltage of the JFET.

The solid-state pixel structure 300 may further comprise a fourth oxide layer 312 and a fifth oxide layer 313 deposited on a first major surface of the epitaxial layer 301 to isolate various metal interconnects, such as the vias 316, 319 and/or the hybrid bond pad 318.

The solid-state pixel structure 300 may further comprise a color filter 321 and a microlens 322. In an exemplary embodiment, the color filter 321 is disposed adjacent to a second major surface of the epitaxial layer 301 and the first oxide layer 303, and the microlens 322 is disposed on a surface of the color filter 321 that opposes the first oxide layer 303. This arrangement is commonly referred to as a "backside illuminated image sensor pixel." The microlens 322 concentrates the impinging photons 229 to enter the pixel body 201 and generate the electrons 309 and holes 310, which are simultaneously generated and integrated (collected) in the n− and p+ doped regions 307 and 302, respectively.

According to various embodiments of the technology and referring to FIGS. 1-7, in operation, the electrons are integrated in a pinned photodiode 201 and are used for sensing a low light level illumination signal simultaneously as the holes are integrated in the pixel floating body region 202. The integrated charge from holes is then used for detecting a high light level illumination signal and is stored in the capacitor 209. The charge-generated signals from the electrons and holes are then readout (i.e., converted to equivalent electron and hole output signal voltages $V_{OUT\_e}$, $V_{OUT\_h}$) using the first readout circuit and the second readout circuit, respectively. In an exemplary embodiment, the hole-generated signal is readout of the capacitor 209 first, the capacitor 209 is reset, and then the electron-generated signal is readout of the photodiode 201. However, the readout order may be reversed.

After readout, the image sensor 145 may convert the electron and hole voltages $V_{OUT\_e}$, $V_{OUT\_h}$, to equivalent digital values (a first digital value and second digital value). The image sensor 145 may then combine the digital values to form a single high dynamic range digital signal.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment wherein the described pixels are formed in the p-type doped semiconductor epitaxial layer with the n+ type doped FD wherein the pinned photodiode collects electrons and the hole signal is sensed on a capacitor connected to the floating body. The polarity of the entire pixel structure, the substrate material and the junctions, can be reversed such that the pixel is formed in the n-type doped semiconductor epitaxial layer with the p+ type doped FD wherein the pinned photodiode collects holes and the electron signal is sensed on a capacitor connected to the floating body.

However, changes and modifications may be made to the exemplary embodiment without departing from the scope of the present technology. These and other changes or modifications are intended to be included within the scope of the present technology, as expressed in the following claims.

The invention claimed is:

1. A stacked pixel circuit formed on a first chip and a second chip, comprising:
   a photodetector configured to generate electron charge and hole charge in response to light;
   a charge overflow device connected to the photodetector and configured to divert the hole charge to a capacitor;
   a floating body node disposed between the photodetector and the capacitor;
   a first readout circuit connected to the photodetector and configured to output an electron charge-generated voltage; wherein the first readout circuit comprises:
      a first reset transistor;
      a first source follower transistor; and
      a first row select transistor;
   a floating diffusion node disposed between the photodetector and the first readout circuit; and
   a second readout circuit connected to the floating body node and configured to output a hole charge-generated voltage; wherein the second readout circuit comprises:
      a second reset transistor;
      a second source follower transistor; and
      a second row select transistor.

2. The pixel circuit according to claim 1, wherein the charge overflow device comprises a junction gate field-effect transistor.

3. The pixel circuit according to claim 1, wherein the charge overflow device comprises a metal-oxide-semiconductor field-effect transistor having a buried channel.

4. The pixel circuit according to claim 1, wherein:
   the first chip comprises:
      the photodetector;
      the capacitor;
      the charge overflow device; and
      the first readout circuit; and
   the second chip is vertically stacked with the first chip and comprises the second readout circuit.

5. The pixel circuit according to claim 4, wherein a hybrid bond connects the capacitor and the second readout circuit.

6. The pixel circuit according to claim 1, further comprising:
   a first current source connected to the first readout circuit; and
   a second current source connected to the second readout circuit.

7. The pixel circuit according to claim 1, wherein the charge overflow device diverts charge from the photodetector after the photodetector reaches a predetermined charge storage threshold.

8. A method for operating an image sensor having a pixel circuit configured to simultaneously integrate electrons and holes, comprising:
   simultaneously integrating electron charge and hole charge in a photodiode;
   transferring the hole charge to a capacitor after the electron charge reaches a predetermined threshold in the photodiode using a charge overflow device;
   converting the electron charge to an electron-generated output voltage using a first readout circuit; and
   converting the hole charge to a hole-generated output voltage using a second readout circuit.

9. The method for operating an image sensor according to claim 8, further comprising:
   converting the electron-generated output voltage to an equivalent first digital value;
   converting the hole-generated output voltage to an equivalent second digital value; and
   combining the first and second digital values to form a single high dynamic range digital signal.

10. The method for operating an image sensor according to claim 9, wherein the image converts the hole charge to the hole-generated output voltage before converting the electron charge to the electron-generated output voltage.

11. A solid-state stacked chip image sensor, comprising:
   an array of pixel circuits, each pixel circuit comprising:
      a photodiode;
      a floating body region;
      a capacitor connected to the floating body region and a ground potential;
      a charge overflow structure comprising a drain connected to the photodiode and configured to:
         divert charge having a first polarity from the photodiode to the drain; and
         divert a corresponding charge of opposite polarity to the capacitor after the photodiode has reached a predetermined charge threshold;
      a first readout circuit connected to:
         a floating diffusion region; and
         the photodiode through a charge transferring device;
         wherein the first readout circuit is configured to output an electron-generated voltage; and
      a second readout circuit connected to the capacitor and configured to output a hole-generated voltage;
   wherein each pixel circuit is formed across a first chip stacked vertically with a second chip, wherein:
      the first chip comprises:
         the photodiode;
         the capacitor; and
         the first readout circuitry; and
      the second chip comprises:
         the second readout circuitry;
         a first current source connected to the first readout circuitry; and
         a second current source connected to the second readout circuitry.

12. The solid-state stacked chip image sensor according to claim 11, wherein the first chip and the second chip are bonded together with hybrid bonds located at each pixel circuit.

13. The solid-state stacked chip image sensor according to claim 12, wherein the hybrid bond is substantially vertically aligned with the photodiode.

14. The solid-state stacked chip image sensor according to claim 11, wherein the charge overflow structure comprises a junction gate field-effect transistor.

15. The solid-state stacked chip image sensor according to claim 11, wherein the charge overflow structure comprises a metal-oxide-semiconductor field-effect transistor.

16. The solid-state stacked chip image sensor according to claim 11, wherein the capacitor is located within a deep trench isolation region, and comprises:
   a first electrode connected to the floating body region; and
   a second electrode connected to a reference potential.

17. The solid-state stacked chip image sensor according to claim 11, wherein the image sensor is configured as a backside illuminated image sensor.

* * * * *